United States Patent
Daubenspeck et al.

(10) Patent No.: US 8,916,464 B2
(45) Date of Patent: Dec. 23, 2014

(54) STRUCTURES AND METHODS FOR IMPROVING SOLDER BUMP CONNECTIONS IN SEMICONDUCTOR DEVICES

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 12/344,711

(22) Filed: Dec. 29, 2008

(65) Prior Publication Data
US 2010/0164096 A1 Jul. 1, 2010

(51) Int. Cl.
*H01L 23/488* (2006.01)
*H01L 21/44* (2006.01)
*H01L 23/00* (2006.01)

(52) U.S. Cl.
CPC ....... *H01L 24/03* (2013.01); *H01L 2924/01074* (2013.01); *H01L 24/13* (2013.01); *H01L 2924/01022* (2013.01); *H01L 2924/01029* (2013.01); *H01L 2924/01019* (2013.01); *H01L 2224/13006* (2013.01); *H01L 2924/01002* (2013.01); *H01L 2924/014* (2013.01); *H01L 2924/01079* (2013.01); *H01L 2924/01327* (2013.01); *H01L 2924/0102* (2013.01); *H01L 2224/05124* (2013.01); *H01L 2224/05166* (2013.01); *H01L 2224/05557* (2013.01); *H01L 2224/05017* (2013.01); *H01L 24/05* (2013.01); *H01L 2224/0401* (2013.01); *H01L 2224/05011* (2013.01); *H01L 2224/05022* (2013.01); *H01L 2224/05551* (2013.01); *H01L 2924/01047* (2013.01); *H01L 2224/0345* (2013.01); *H01L 16225* (2013.01); *H01L 2224/05555* (2013.01); *H01L 2924/01005* (2013.01); *H01L 2224/05644* (2013.01); *H01L 2224/05147* (2013.01); *H01L 2224/* (2013.01); *H01L 2924/14* (2013.01); *H01L 2924/00013* (2013.01); *H01L 2224/03452* (2013.01); *H01L 2924/01033* (2013.01); *H01L 2224/13111* (2013.01); *H01L 2924/01082* (2013.01); *H01L 2224/05155* (2013.01); *H01L 2924/01006* (2013.01); *H01L 2924/01093* (2013.01); *H01L 2224/16227* (2013.01); *H01L 2924/01013* (2013.01); *H01L 2924/01078* (2013.01)

USPC ........................................... 438/613; 257/738

(58) Field of Classification Search
USPC .......... 438/613, 614; 257/737, 738, E23.015, 257/E23.02
See application file for complete search history.

(56) References Cited

U.S. PATENT DOCUMENTS

| | | | |
|---|---|---|---|
| 6,426,557 B1 | 7/2002 | Daubenspeck et al. | |
| 6,610,595 B2 * | 8/2003 | Seshan | 438/652 |
| 7,033,923 B2 | 4/2006 | Seshan | |
| 7,034,402 B1 * | 4/2006 | Seshan | 257/781 |
| 7,049,171 B2 | 5/2006 | Brauer | |
| 2005/0093113 A1 | 5/2005 | Lin et al. | |
| 2006/0131748 A1 | 6/2006 | Seshan | |
| 2006/0278984 A1 * | 12/2006 | Yamada | 257/737 |

FOREIGN PATENT DOCUMENTS

| | | |
|---|---|---|
| JP | 05283412 A | 10/1993 |
| JP | 2008060142 A | 3/2008 |

* cited by examiner

*Primary Examiner* — Daniel Shook
(74) *Attorney, Agent, or Firm* — David Cain; Roberts Mlotkowski Safran & Cole, P.C.

(57) ABSTRACT

Structures with improved solder bump connections and methods of fabricating such structures are provided herein. The structure includes a via formed in a dielectric layer to expose a contact pad and a capture pad formed in the via and over the dielectric layer. The capture pad has openings over the dielectric layer to form segmented features. The solder bump is deposited on the capture pad and the openings over the dielectric layer.

20 Claims, 7 Drawing Sheets

STRUCTURES AND METHODS FOR IMPROVING SOLDER BUMP CONNECTIONS IN SEMICONDUCTOR DEVICES

FIELD OF THE INVENTION

The invention relates to integrated circuits, and more particularly, to structures with improved solder bump connections and methods of fabricating such structures.

BACKGROUND

Traditionally, high temperature C4 (Controlled Collapse Chip Connection) bumps have been used to bond a chip to a substrate with the most common and widely utilized package being an organic laminate. Conventionally, the C4 bumps (solder bumps) are made from leaded solder, as it has superior properties. For example, lead is known to mitigate thermal coefficient (TCE) mismatch between the chip and the substrate (i.e., organic laminate). Accordingly, stresses imposed during the cooling cycle are mitigated by the C4 bumps, thus preventing delaminations or other damage from occurring to the chip or the substrate.

Lead-free requirements are now being imposed by many countries forcing manufacturers to implement new ways to produce chip to substrate joints. For example, solder interconnects consisting of tin/copper, tin/silver (with high concentrations of silver) and tin/gold in combination with SAC alloys are being used as a replacement for the leaded solder interconnects. With lead-free requirements, though, concerns about defects in C4 interconnections have surfaced, e.g., cracks in chip metallurgy under C4 bumps (named "white bumps" due to their appearance in CSAM inspection processes) which lead to failure of the device. More specifically, white bumps are C4's that do not make good electrical contact to the Cu last metal pad, resulting in either failing chips at functional test or in the field. This may be attributable, at least in part, due to chip designs using high stress Pb-free C4 (solder bumps) which exacerbate C4/AlCu bump to Cu wire adhesion problems.

As one illustrative example, during the chip joining reflow, the chip and its substrate are heated to an elevated temperature (about 250° C.) in order to form the solder interconnection joints. The initial portion of the cool down leads to little stress build up; however, as the joints solidify (around 180° C. for small lead-free joints), increased stress is observed on the package. In particular, as the package (laminate, solder and chip) begins to cool, the solder begins to solidify (e.g., at about 180° C.) and the laminate begins to shrink as the chip remains substantially the same size. The difference in thermal expansion between the chip and the substrate is accommodated by out-of-plane deformation of the device and the substrate, and by the shear deformation of the solder joints. The peak stresses on the device occur during the cool down portion of the reflow.

As the solder is robust and exceeds the strength of the chip, tensile stresses begin to delaminate structures on the chip. The high shear stresses caused by the TCE mismatch between the chip (3.5 ppm) and the laminate (16 ppm) results in an interfacial failure (i.e., a separation between the BEOL copper and the dielectric (e.g., FSG) under the C4). This interfacial failure embodies itself as cracks in the chip metallurgy under C4 bumps.

Accordingly, there exists a need in the art to overcome the deficiencies and limitations described hereinabove.

SUMMARY

In a first aspect of the invention, a method of manufacturing a semiconductor structure comprises forming a capture pad over an insulative material and contact pad; segmenting the capture pad over the insulative material; and forming a solder bump over the capture pad and between the segments.

In a second aspect of the invention, a method of manufacturing a package comprises heating the package to a set temperature in order to form solder interconnection joints and cooling the package to solidify the solder interconnection joints. The method further comprises terminating fatigue crack initiation in at least one segmented portion of a ball limiting metallurgy of the package.

In a third aspect of the invention, a structure comprises a via formed in a dielectric layer to expose a contact pad. A capture pad is formed in the via and over the dielectric layer. The capture pad has openings over the dielectric layer to form segmented features. The solder bump is deposited on the capture pad and the openings over the dielectric layer.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to structures with improved solder bump connections and methods of fabricating such structures. More specifically, the present invention provides structures and methods of manufacturing such structures which substantially or completely eliminate fatigue cracks or delamination from occurring in underlying BEOL (back end of line) vias and related metal interconnects and/or pads and/or wires. For example, in implementation, the present invention prevents C4 stresses from being translated along the capture pad to a final via opening where it can terminate through a conductive pad (e.g., Al pad) to the underlying BEOL metal via. This can be accomplished by providing a segmented capture pad deposited directly over the conductive pad and intervening passivation layer. This reduces manufacturing and material costs.

The present invention is applicable to all C4 processes including plating, screening, and physical placement method such as C4NP (Controlled Collapse Chip Connection New Process) processes. C4NP processes, pioneered by International Business Machines Corp., provide flip chip technology combining the advantages of 100 percent lead-free, high reliability, fine pitch, lower material cost, as well as the flexibility to use virtually all types of solder compositions. The processes and structures herein can be used for known and upcoming generations, and is especially applicable to 300 mm wafer technology using C4NP. Accordingly, the processes of the present invention will provide benefits for future copper wiring generations.

Figure 1:
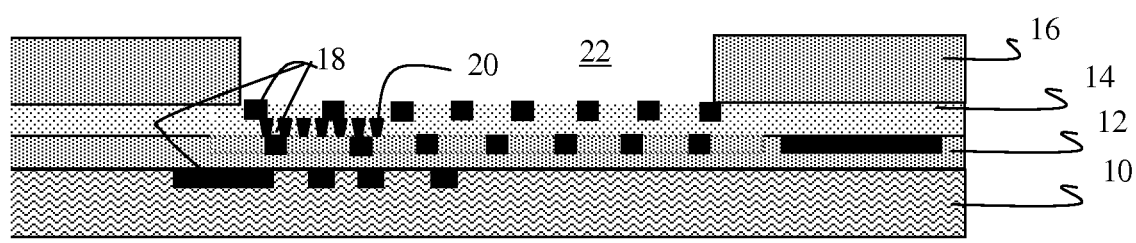
FIGS. 1-5 show intermediate structures and respective processing steps in accordance with aspects of the invention.

FIGS. 1-5 show intermediate structures and respective processing steps in accordance with aspects of the invention; In particular, FIG. 1 shows a beginning structure comprising four layers of dielectric material 10, 12, 14 and 16. Those of skill in the art will recognize that the present invention is not limited to the number and composition of the dielectric layers described herein, and that the present invention is equally applicable with other dielectric layers. In embodiments, the dielectric layer 10 is a low-k dielectric such as, for example, carbon-doped oxide or SiCOH. The dielectric layers 12 and 14 can be, for example, $SiO_2$ or fluoro-silicate glass (FSG). The dielectric layer 16 can be, for example, a layered structure of SiN, $SiO_2$ and SiN or a polymeric layer such as photosensitive polyimide (PSPI).

The structure of FIG. 1 also includes BEOL metal pads and wires 18, such as, for example, Cu pads and wires formed in trenches of the dielectric layers 10, 12 and 14. In embodiments, the formation of the trenches and the deposition of the conductive material to form the metal pads and wires 18 is processed using conventional photolithography, etching (e.g., reactive ion etching (RIE)) and deposition (e.g., chemical vapor deposition (CVD)) techniques. As such, further explanation is not required for a person or ordinary skill in the art to practice the invention. A chemical mechanical polishing (CMP) can also be performed to planarize the surface of each successive layer.

BEOL interconnect structures 20 are representatively shown as formed in the structure of FIG. 1 to electrically connect to the pads and wires 18. The interconnect structures 20 (formed in vias) can be formed in any conventional manner such as, for example, using lithography, etching (e.g., RIE) and polishing (e.g., CMP) processes known to those of skill in the art that further explanation is not required to understand the invention. In embodiments, the pads and wires 18 as well as the interconnect structures 20 can be formed in the dielectric layers using dual damascene process, well known to those of skill in the art. The pads and wires 18 ca be made from conductive material such as, for example, copper.

Still referring to FIG. 1, a via 22 is formed in the dielectric layer 16 to expose an Mx+1 layer of the pads and wires 18. The via 22 can be formed using conventional lithography and etching techniques. In embodiments, the via 22 can range in width, depending on the particular application. For example, the via 22 can be 50 to 100 microns, although these dimensions should not be considered a limiting feature of the present invention.

Figure 2:
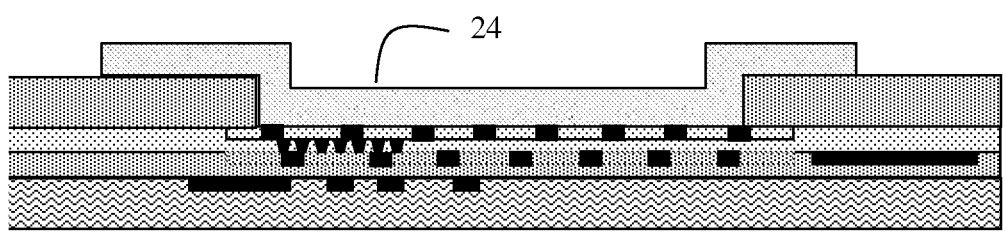

FIG. 2 shows a conductive pad 24 conformally deposited on the structure of FIG. 1. More specifically, the conductive pad 24 can be an Al pad, deposited in the via of FIG. 1, in addition to over portions of the dielectric layer 16. In embodiments, the Al pad can be deposited using, for example, CVD or sputtered aluminum deposition techniques. The conductive pad 24 is approximately 1 micron thick; although, other dimensions are also contemplated by the present invention.

Figure 3:
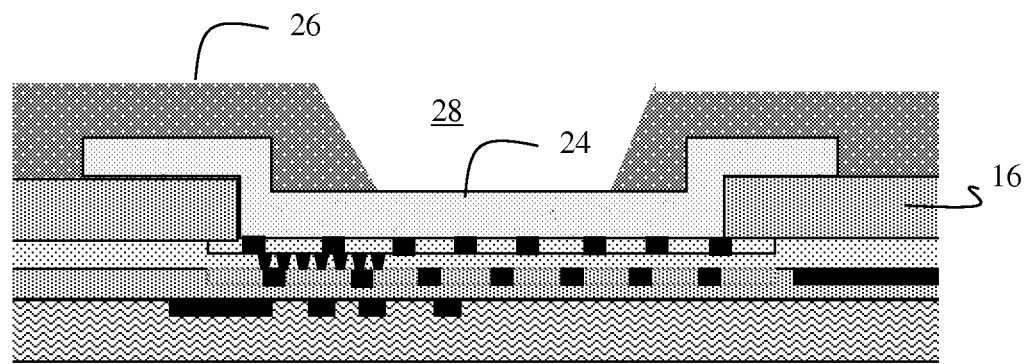

In FIG. 3, a polyimide or other type of insulative material 26 is deposited on the structure of FIG. 2. More specifically, a photosensitive polyimide can be deposited on the conductive pad 24 and dielectric layer 16. The insulative material 26 can be deposited using a conventional deposition method such as, for example, spin-on deposition. In embodiments, the insulative material 26 can range in thickness from about 5 to 10 microns in height; although other dimensions are also contemplated by the invention. In the embodiment of photosensitive polyimide, the material is exposed and developed to form a via 28, exposing the underlying pad 24. In embodiments using other insulative materials, a conventional lithography and etching process can be used to from the via 28.

Figure 4:
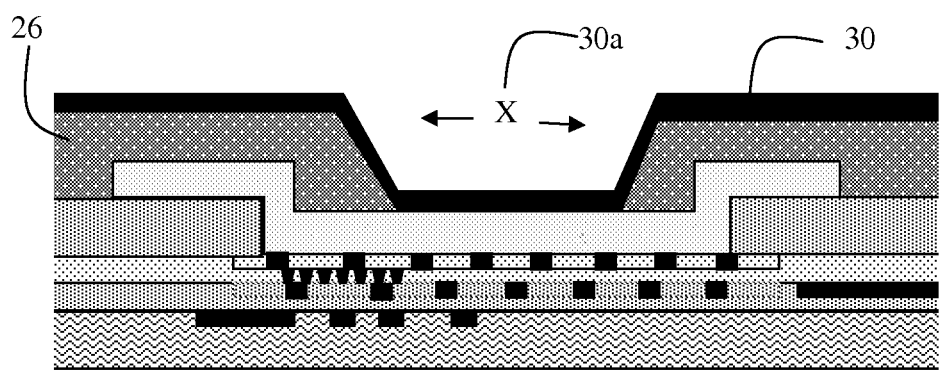

As shown in FIG. 4, a UBM/BLM pad or capture pad structure 30 is deposited over the insulative material 26 (and in the via 28) and makes contact with the contact pad 24. The capture pad structure 30 may be several layers such as, for example, a nickel material sandwiched between an upper gold layer and a bottom barrier layer. The barrier layer may be a TiW barrier layer with a thickness of typically about 1000 Å to 2000 Å; although other dimensions are contemplated by the invention. The gold layer may be typically about 200 Å; although other dimensions are also contemplated by the invention. The nickel layer may be a few microns in thickness; although other dimensions are also contemplated by the invention. A capture pad area 30a may range from typically about 1 micron to 500 microns, with a preferred spacing (width) of about 50 microns. In further embodiments, the capture pad structure 30 can be TiW/Cu/Ni film, where TiW can be typically about 1000-2000 Å, the Cu is typically about 0.5 μm to 1 μm and the Ni cap is typically about 1 μm to 2 μm in thickness. In embodiments, a thin layer of Au film or Cu film (typically about 0.1 μm to 0.5 μm) can be deposited on the Ni cap.

Figure 5:
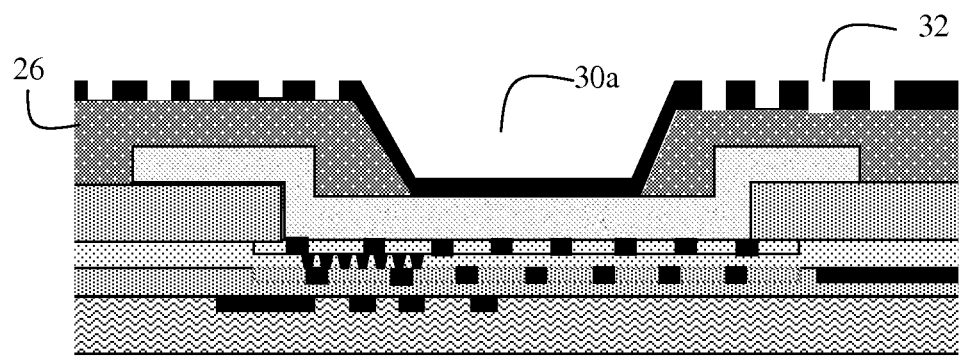

FIG. 5 shows openings (holes) 32 formed in the capture pad structure 30. In embodiments, the openings 32 form a segmented capture pad and more particularly a segmented ball limiting metallurgy (BLM) capture pad structure 30. In embodiments, the openings 32 can be formed in many different patterns such as shown, for example, in FIGS. 6-8d, explained below. In one embodiment, the openings 32 can range from 1 micron to 10 microns across and are preferably arranged over the insulative material 26. In embodiments, the openings 32 extend to the insulative material 26, but do not extend over the capture pad area 30a. The openings 32 can be patterned using a subtractive etch, such as a wet etch, RIE, or other conventional etching process known to those of skill in the art.

The segments of the capture pad structure 30 provide many advantages such as, for example, lateral (e.g., side to side) bend flexibility for a C4 structure in response to white bumps shear stresses, as well as effective crackstop for C4:BLM fatigue crack initiation. More specifically, the C4 stress deformation can be absorbed by the movement of the segmented portions, directing the stresses into the underlying insulative material 26 and away form the metal pads, wires and interconnects. This will prevent the formation of white bumps.

Figure 6:
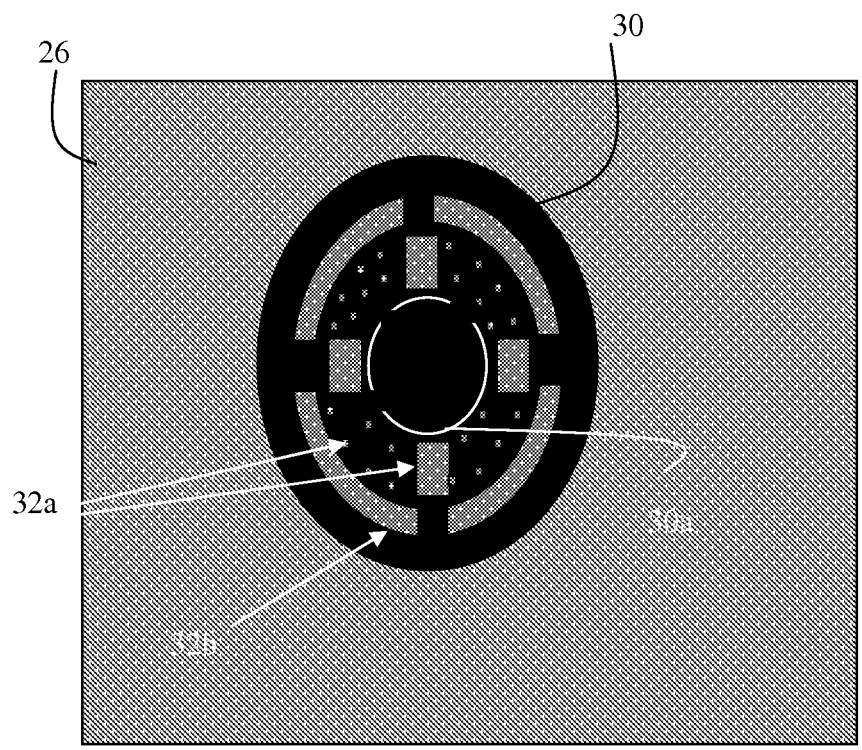
FIGS. 6-8d shows various opening patterns in an upper contact layer in accordance with the aspects of the invention.

FIGS. 6-8d show various different arrangements of the openings and/or other segmented areas of the capture pad structure 30. For example, FIG. 6 shows several sized openings 32a (e.g., smaller and larger openings) arranged over the insulative layer 26 and around the capture pad area 30a. The openings can range in width from about 1 micron to 10 microns. Also, the openings include radial or arc-shaped segments 32b surrounding the openings 32a. In each of these embodiments, the openings extend to the underlying insulative material 26, but are not provided on the capture pad area 30a.

Figure 7:
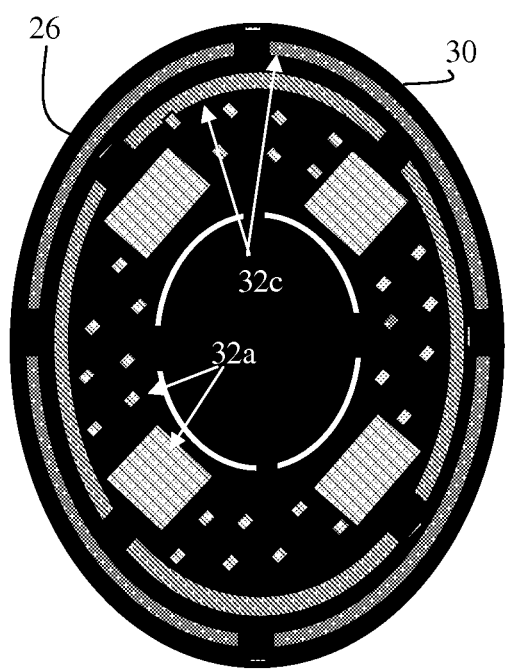

FIG. 7 shows several sized openings 32a (e.g., smaller and larger openings) arranged over the insulative layer 26 and around the capture pad area 30a. The openings can range in width from about 1 micron to 10 microns. Also, the openings include radial or arc-shaped offset segments 32c surrounding the several sized openings 32a. In each of these embodiments, the openings extend to the underlying insulative material 26, but are not provided on the capture pad area 30a.

Figure 8A:
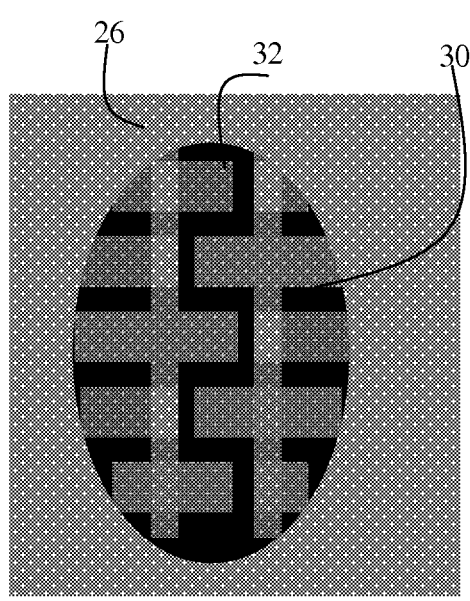
Figure 8B:
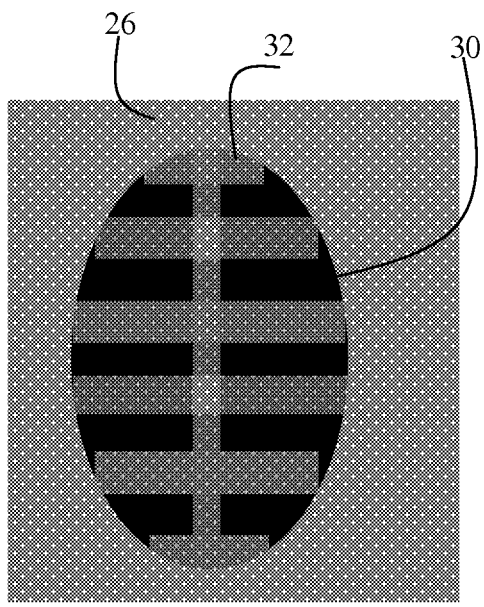
Figure 8C:
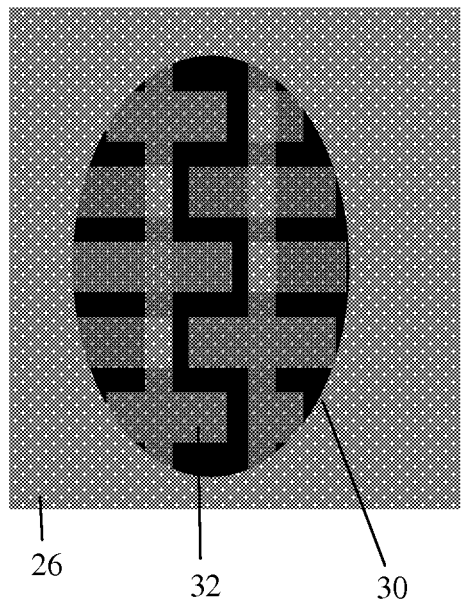
Figure 8D:
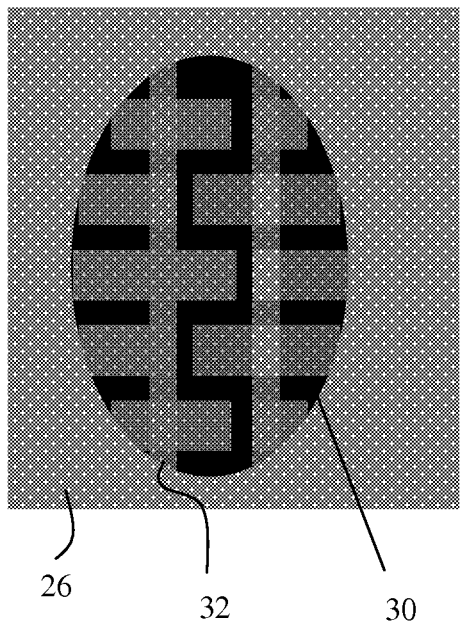

FIGS. 8a-8d show various other opening patterns. FIG. 8a shows a single via configuration, FIG. 8b shows a single via bar configuration, and FIGS. 8c and 8d show multiple via configurations. As such, it should be understood that FIGS. 8a-8d represent various contemplated configurations, which can additionally include patterns of one or more openings or shapes such as a grid pattern, checkerboard pattern, segmented lines, overlapping lines, offset lines, perpendicular lines, and any combination thereof. In these embodiments, the patterns are arranged over the insulative layer 26 and around the capture pad area 30a. The openings extend to the underlying insulative material 26, but are not provided on the capture pad area 30a and capture pad 30.

Figure 9:
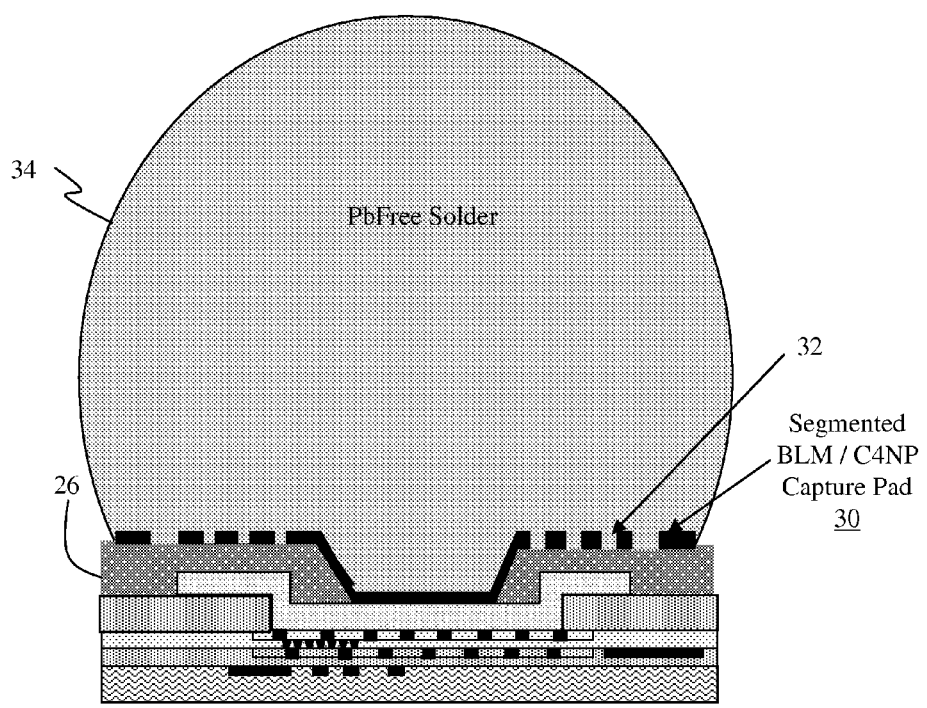
FIG. 9 shows a final structure and respective processing steps in accordance with the second aspect of the invention.

In FIG. 9, a solder bump is deposited on the structure of FIG. 8. More specifically, a lead-free solder bump 34 such as, for example, tin/copper, tin/silver and tin/gold in combination with SAC alloys, is deposited on the capture pad area 30a and capture pad 30. The solder bump 34 will also be deposited within the openings 32, extending to the insulative material 26.

Figure 10:
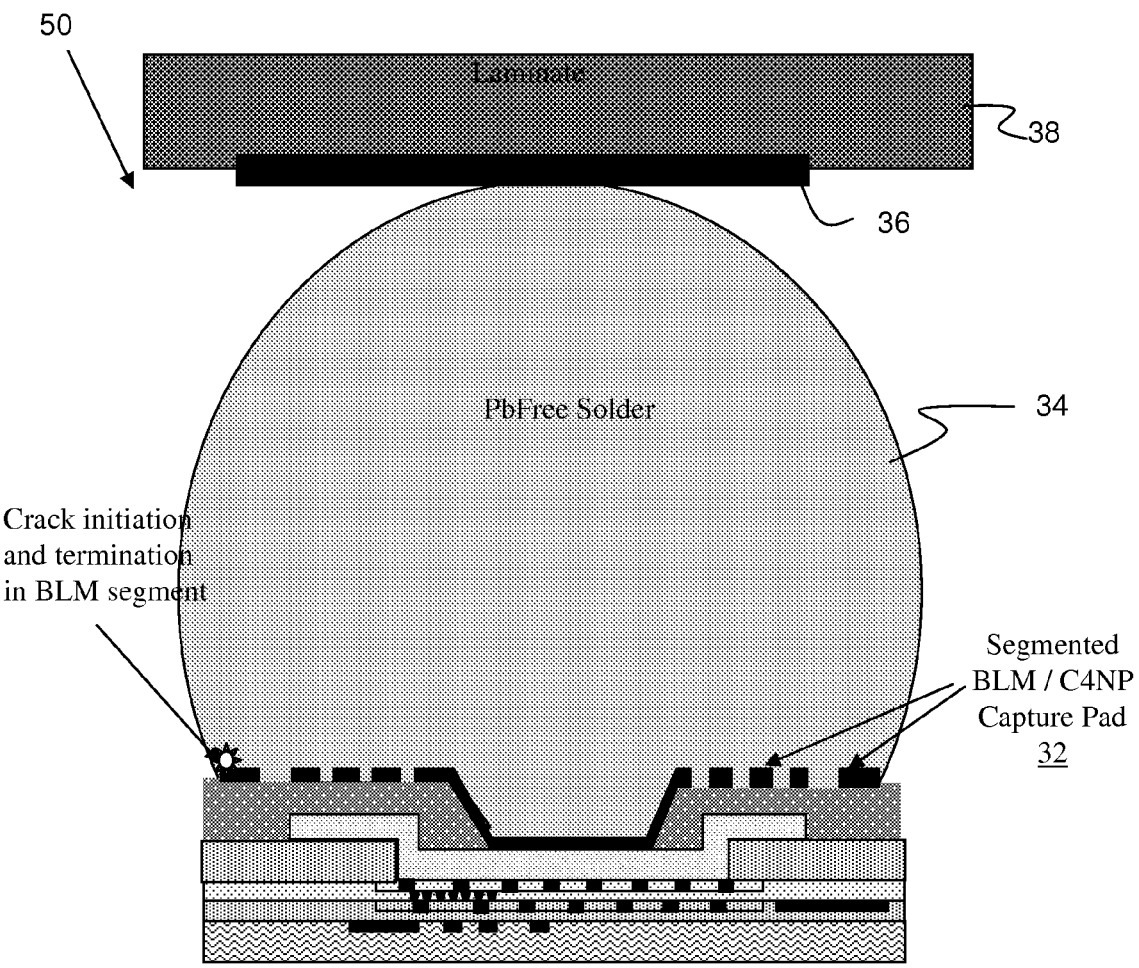
FIG. 10 shows another final structure and respective processing steps in accordance with the fifth aspect of the invention.

FIG. 10 shows a packaged chip generally designated as reference numeral 50. The packaged chip 50 shows the solder bump 34 connected to a bonding pad 36 of a laminate 38. The laminate 38 can be an organic or ceramic laminate. FIG. 10 also graphically shows fatigue crack initiation and termination in BLM segment (capture pad 30).

As should now be understood by those of skill in the art, the present invention adds a segmentation pattern to the photolithographically patterned UBM/BLM on a polyimide surface (PSPI), designed in such a way as to impart flexibility to the C4/BLM structure, so that as it bends in response to peripheral forces it dissipates stress into the polyimide surface (as opposed to transferring it along the BLM/UBM surface and channeling it into the final via where it acts to break the underlying BEOL, causing delamination and cracking). With the segmentation pattern which has no straight-line path from the periphery of the C4/BLM structure to the center of the structure (at the final via location) the pattern interruptions act as termination points for the propagation of any crack. That is, the C4 fatigue crack will not propagate along the interface between the intermetallic (IMC) compound in the BLM and the solder material. These "interruption" points do not have any BLM material, as they mark the edge of a gap in the segmentation pattern so that a crack propagating along through the IMC encounters a break in the continuity of the IMC. This is superior to the "known" solutions because of these properties of shear stress dissipation (white bumps) and C4 fatigue crack termination. This structure is be applicable to any two parts being joined with a C4 solder bump, particularly for lead free C4s, and including any chip stacking or "3D" application.

As thus should be understood in view of the present disclosure, the segmented capture pad 30 will direct the shear stresses created during cool down of the package to the insulative layer 26. In other words, the openings 32 will stop the shear stresses from translated along the length of capture pad to a metal, where it would otherwise terminate to the underlying BEOL interconnect structures 20 and pads and wires 18. This will thus eliminate any delamination cracks forming at such locations.

As one illustrative example, during the chip joining reflow, the chip and its substrate are heated to an elevated temperature (about 250° C.) in order to form the solder interconnection joints. The initial portion of the cool down leads to little stress build up; however, as the joints solidify (around 180° C. for small lead-free joints), increased stress begins to form. In particular, as the package (laminate, solder and chip) begins to cool, the solder begins to solidify (e.g., at about 180° C.) and the laminate begins to shrink as the chip remains substantially the same size. The difference in thermal expansion between the chip and the substrate is accommodated by out-of-plane deformation of the device and the substrate, and by the shear deformation of the solder joints.

The peak stresses on the device occur during the cool down portion of the reflow. As the solder is robust and exceeds the strength of the chip, tensile stresses will begin to form on the capture pad. However, the openings 32 will stop the shear stresses from translating along the length of capture pad to a metal, where it would otherwise terminate to the underlying BEOL interconnect structures 20 and pads and wires 18. More specifically, the C4 stress deformation can be absorbed by the movement of the segmented portions, directing the stresses into the underlying insulative material 26 and away form the metal pads, wires and interconnects. This will prevent the formation of white bumps. The movement of the segmented portions of the BLM is facilitated by the softness of the underlying polymeric material (PSPI); however, it is noted that is not absolutely necessary to have such a soft material for the invention to work in its intended manner.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a semiconductor structure, comprising:

forming a capture pad structure over an insulative material and a via formed therein to contact an underlying contact pad;

segmenting the capture pad structure over the insulative material surrounding the via such that openings are formed in the capture pad structure over the insulative material to form a plurality of capture pad structure openings surrounding the via; and forming a solder bump over capture pad structure and between the segments.

2. The method of claim 1, wherein the segmenting is provided by an etching process and the insulative material is a soft polymer layer.

3. The method of claim 1, wherein the capture pad structure is formed by depositing layers.

4. The method of claim 3, wherein the layers include one of:
a nickel material sandwiched between a gold layer and a barrier layer; and
a TiW/Cu/Ni structure.

5. The method of claim 4, wherein the barrier layer is a TiW barrier layer.

6. The method of claim 1, wherein the solder bump is a lead free solder bump.

7. The method of claim 1, wherein the segmenting includes forming the openings in the capture pad structure over the insulative material by an etching process.

8. The method of claim 7, wherein the etching forms openings of various shapes and sizes in the capture pad structure to form the segments.

9. The method of claim 1, wherein the solder bump covers no more than one via.

10. A method of manufacturing a package, comprising:
depositing a capture pad structure on an insulative material, and which contacts with an underlying contact pad;
segmenting the capture pad structure into a ball limiting metallurgy capture pad structure having a plurality of openings surrounding a via structured for solder connection;
heating the package which includes the ball limiting metallurgy capture pad to a set temperature in order to form solder interconnection joints;
cooling the package to solidify the solder interconnection joints; and
moving at least one segmented portion of the ball limiting metallurgy capture pad of the package to terminate fatigue crack initiation.

11. The method of claim 10, wherein the movement absorbs stresses, which cause the fatigue crack initiation.

12. The method of claim 11, further comprising directing the stresses into an underlying flexible insulative material for flexibility of a ball limiting metallurgy or under bump metallurgy segments and away from metal pads, wires and interconnects thereby preventing the formation of white bumps.

13. The method of claim 10, wherein the solder interconnection joints include lead free solder bumps.

14. The method of claim 10, wherein the segmented portion comprises openings of various shapes and sizes.

15. The method of claim 10, wherein the segmented portion comprises a plurality of rows of openings.

16. The method of claim 10, wherein the segmented portion comprises openings in the form of a non-contiguous plurality of openings.

17. The method of claim 10, wherein the segmented portion comprises openings comprising arc-shaped openings surrounding other openings.

18. The method of claim 10, wherein the solder interconnection joints include a solder bump covering no more than one via formed in an insulative material.

19. The method of claim 10, further comprising forming a solder bump over the segmented capture pad structure and between the segments.

20. A method of manufacturing a package, comprising:
heating the package to a set temperature in order to form solder interconnection joints;
cooling the package to solidify the solder interconnection joints; and
moving at least one segmented portion of a ball limiting metallurgy of the package to terminate fatigue crack initiation,
wherein a capture pad structure is segmented into a ball limiting metallurgy capture pad structure having a plurality of openings surrounding a via structured for solder connection.

* * * * *